(12) United States Patent
Borthakur et al.

(10) Patent No.: US 12,604,551 B2
(45) Date of Patent: Apr. 14, 2026

(54) IMAGE PIXELS HAVING IR SENSORS WITH REDUCED EXPOSURE TO VISIBLE LIGHT

(71) Applicant: SEMICONDUCTOR COMPONENTS INDUSTRIES, LLC, Phoenix, AZ (US)

(72) Inventors: Swarnal Borthakur, Boise, ID (US); Andrew Eugene Perkins, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 637 days.

(21) Appl. No.: 17/647,999

(22) Filed: Jan. 14, 2022

(65) Prior Publication Data

US 2023/0230989 A1 Jul. 20, 2023

(51) Int. Cl.
*H10F 39/00* (2025.01)
*H10F 39/18* (2025.01)
*H10F 71/00* (2025.01)

(52) U.S. Cl.
CPC ....... *H10F 39/8063* (2025.01); *H10F 39/184* (2025.01); *H10F 39/8053* (2025.01); *H10F 71/00* (2025.01)

(58) Field of Classification Search
CPC ......... H01L 27/14627; H01L 27/14621; H01L 31/18; H01L 27/14649; H10F 39/8063; H10F 39/8053; H10F 71/00; H10F 39/184; H10F 39/806; H10F 39/182
See application file for complete search history.

(56) References Cited

U.S. PATENT DOCUMENTS

| | | | | |
|---|---|---|---|---|
| 10,811,453 | B1 * | 10/2020 | Mun | H01L 27/1464 |
| 2015/0381907 | A1 * | 12/2015 | Boettiger | H01L 27/14643 348/164 |
| 2017/0115436 | A1 | 4/2017 | Qian | |
| 2017/0140221 | A1 | 5/2017 | Ollila | |
| 2019/0006406 | A1 * | 1/2019 | Ozawa | H01L 27/1462 |
| 2019/0148434 | A1 | 5/2019 | Hsu | |
| 2022/0216261 | A1 * | 7/2022 | Lu | H10F 39/182 |
| 2023/0223416 | A1 * | 7/2023 | Mun | H01L 27/14689 257/432 |
| 2024/0055465 | A1 * | 2/2024 | Murata | H01L 27/14636 |

FOREIGN PATENT DOCUMENTS

CN 110797429 A * 2/2020

* cited by examiner

*Primary Examiner* — Georgia Y Epps
*Assistant Examiner* — Erin R Garber
(74) *Attorney, Agent, or Firm* — Dickinson Wright PLLC

(57) ABSTRACT

Image pixels having IR sensors with reduced exposure to visible light. One example is an image sensor comprising: a photosensitive region; a lower optical filter above the photosensitive region, and the lower optical filter configured to filter visible light and to pass infrared light; and an upper optical filter above the lower optical filter, and the upper optical filter configured to filter visible light and to pass infrared light.

14 Claims, 11 Drawing Sheets

*F*IG.6

*F<small>IG</small>.7*

*F*IG.10

IMAGE PIXELS HAVING IR SENSORS WITH REDUCED EXPOSURE TO VISIBLE LIGHT

CROSS-REFERENCE TO RELATED APPLICATIONS

Not Applicable.

BACKGROUND

Image sensors are used in electronic devices such as cellular telephones, cameras, and computers to capture images. In particular, an electronic device is provided with an array of image pixels arranged in a grid pattern. Each image pixel receives incident photons (i.e., light) and converts the photons into electrical signals. Column circuitry is coupled to each column for reading out sensor signals from each image pixel.

Image pixels may include microlenses that focus light incident into the photosensitive regions, and the photosensitive regions may be formed from a semiconductor material, such as silicon. The silicon absorbs photons of the light to create the electrical signals. Many image sensors include image pixels arranged to detect the infrared. However, visible light "leaking" into the photosensitive regions designed for infrared detection adversely affects sensitivity to the infrared light.

SUMMARY

One example is an image sensor comprising: a photosensitive region; a lower optical filter above the photosensitive region, and the lower optical filter configured to filter visible light and to pass infrared light; and an upper optical filter above the lower optical filter, and the upper optical filter configured to filter visible light and to pass infrared light.

The example image sensor may further comprise: a grid of metallic material below the upper optical filter; and the lower optical filter disposed between the upper optical filter and the grid of metallic material. The lower optical filter may be disposed in a conformal arrangement on the grid of metallic material.

The example image sensor may further comprise the lower optical filter abutting an oxide layer disposed between the upper optical filter and the photosensitive region, the oxide layer comprising at least one selected from a group consisting of: aluminum oxide and tantalum oxide; hafnium oxide and tantalum oxide; aluminum-hafnium-oxide and tantalum oxide; and aluminum oxide and hafnium oxide.

The example image sensor may further comprise: a diffuser in operational relationship to the photosensitive region; the lower optical filter disposed over the diffuser in a conformal arrangement.

The example image sensor may further comprise the lower optical filter extends into a trench surrounding the photosensitive region.

In the example image sensor, the lower optical filter may be at least one selected from a group consisting of: aluminum nitride (AlN); and aluminum antimonide (AlSb).

Another example is an imaging system comprising: a lens system; an image sensor in operational relationship to the lens system; an imaging system controller electrically coupled to the image sensor; and the image sensor comprising an array of image pixels, at least one image pixel of the array of image pixels having an IR sensor. The IR sensor may comprise: a photosensitive region defining a perimeter; a lower optical filter above the photosensitive region, the lower optical filters defines a perimeter coextensive with the perimeter of the photosensitive region, and the lower optical filter configured to filter visible light and to pass infrared light; and an upper optical filter above the lower optical filter, the upper optical filter defines a perimeter coextensive with the perimeter of the photosensitive region, and the upper optical filter configured to filter visible light and to pass infrared light.

In the example imaging system, the image sensor may further comprise: a grid of metallic material below the upper optical filter; and the lower optical filter disposed between the upper optical filter and the grid of metallic material.

In the example imaging system, the image sensor further comprises the lower optical filter disposed in a conformal arrangement on the grid of metallic material.

In the example imaging system, the image sensor may further comprise: a diffuser in operational relationship to the photosensitive region; the lower optical filter disposed over the diffuser in a conformal arrangement.

In the example imaging system, the lower optical filter may extend into a trench surrounding the photosensitive region.

In the example imaging system, the lower optical filter may be at least one selected from a group consisting of: aluminum nitride (AlN); and aluminum antimonide (AlSb).

The example imaging system may be at least one selected from a group consisting of: an automobile; a vehicle; a camera; a cellular telephone; a tablet computer; a webcam; a video camera; a video surveillance system; and a video gaming system.

Yet another example is a method of constructing an image sensor, the method comprising: forming an image pixel comprising a plurality of sensors, each sensor having a photosensitive region; placing an upper optical filter over the photosensitive region of a first sensor of the plurality of sensor, the upper optical filter passes infrared light and reduces or blocks visible light; and placing a lower optical filter over the photosensitive region of the first sensor, the lower optical filter passes infrared light and reduces or blocks visible light.

In the example method, placing the upper optical filter may further comprise placing the upper optical filter between a microlens for the first sensor and a grid of metallic material. Placing the lower optical filter may further comprise at least one selected from a group consisting of: placing the lower optical filter in a layer between the upper optical filter and the grid of metallic material; and placing the lower optical filter in a conformal arrangement on the grid of metallic material and in a layer between the upper optical filter and the grid of metallic material.

In the example method, placing the lower optical filter may further comprise placing the lower optical filter in a layer between the grid of metallic material and the photosensitive region of the first sensor. In some cases, the lower optical filter may be placed over a diffuser in a conformal arrangement. In some cases, the lower optical filter may extend into a trench surrounding the photosensitive region of the first sensor.

In the example the example method, the lower optical filter may be at least one selected from a group consisting of: aluminum nitride (AlN); and aluminum antimonide (AlSb).

BRIEF DESCRIPTION OF THE DRAWINGS

For a detailed description of example embodiments, reference will now be made to the accompanying drawings in which.

DEFINITIONS

Figure 1A:
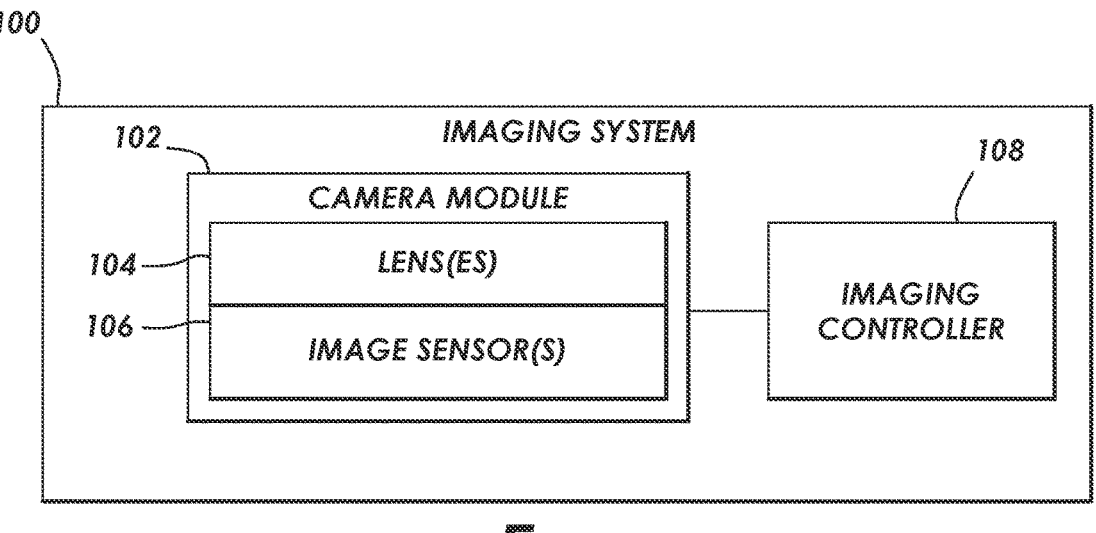
FIG. 1A shows an imaging system in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Terms defining an elevation, such as "above," "below," "upper", and "lower" shall be locational terms in reference to a direction of light incident upon a sensor of an image pixel. Light entering the sensor shall be considered to interact with or pass objects and/or structures that are "above" and "upper" before interacting with or passing objects and/or structures that are "below" or "lower." Thus, the locational terms may not have any relationship to the direction of the force of gravity.

"IR" shall mean infrared.

In relation to electrical devices (whether stand alone or as part of an integrated circuit), the terms "input" and "output" refer to electrical connections to the electrical devices, and shall not be read as verbs requiring action. For example, a differential amplifier (such as an operational amplifier) may have a first differential input and a second differential input, and these "inputs" define electrical connections to the operational amplifier, and shall not be read to require inputting signals to the operational amplifier.

"Controller" shall mean, alone or in combination, individual circuit components, an application specific integrated circuit (ASIC), a microcontroller with controlling software, a reduced-instruction-set computing (RISC) with controlling software, a digital signal processor (DSP) with controlling software, a processor with controlling software, a programmable logic device (PLD) with controlling software, or a field programmable gate array (FPGA), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to image sensors having image pixels with IR sensors arranged for reduced exposure to visible light. More particularly, various examples are directed to image pixels having IR sensors designed to detect infrared by having multiple optical filters designed and constructed to filter visible light and pass infrared light. More particularly still, various examples are directed to image pixels with IR sensors having an upper optical filter between the microlens and the grid of metallic material, and a lower optical filter (e.g., aluminum nitride (AlN) and/or aluminum antimonide (AlSb)) disposed between the upper optical filter and the photosensitive region of the IR sensor. The specification first turns to an example system to orient the reader.

FIG. 1A shows an example imaging system. In particular, the example imaging system 100 may be a portable electronic device such as a camera, a cellular telephone, a tablet computer, a webcam, a video camera, a video surveillance system, or a video gaming system with imaging capabilities. In other cases, imaging system may be an automotive imaging system. Camera module 102 may be used to convert incoming light into digital image data. Camera module 102 may include one or more lenses 104 and one or more corresponding image sensors 106. Lenses 104 may include fixed and/or adjustable lenses. During image capture operations, light from a scene may be focused onto image sensor 106 by lenses 104. Image sensor 106 may comprise circuitry for converting analog pixel data into corresponding digital image data to be provided to the imaging controller 108. If desired, camera module 102 may be provided with an array of lenses 104 and an array of corresponding image sensors 106.

The imaging controller 108 may include one or more integrated circuits (e.g., image processing circuits, microprocessors, storage devices such as random-access memory and non-volatile memory, etc.) and may be implemented using components that are separate from camera module 102 and/or that form part of camera module 102 (e.g., circuits that form part of the image sensor 106). Digital image data captured by camera module 102 may be processed and stored using the imaging controller 108. Processed image data may, if desired, be provided to external equipment (e.g., a computer, external display, or other device) using wired and/or wireless communications paths coupled to imaging controller 108.

Figure 1B:
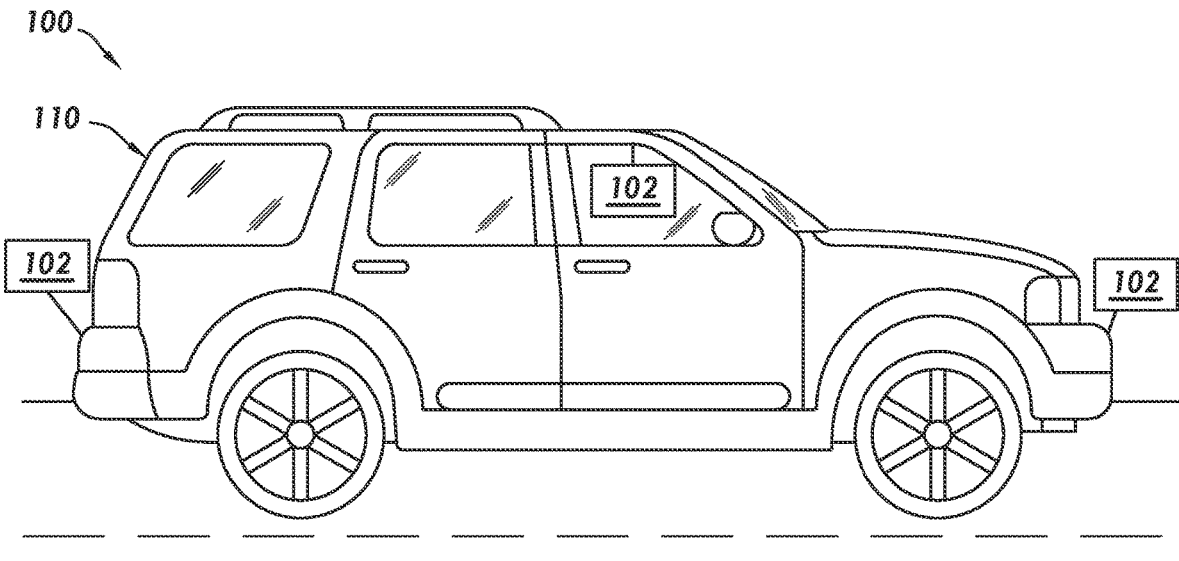
FIG. 1B shows an implementation of an imaging system, in accordance with at least some embodiments.

FIG. 1B shows an example imaging system. In particular, in the example imaging system 100 comprises an automobile or vehicle 110. Vehicle 110 is illustratively shown as a passenger vehicle, but the example imaging systems 100 may be type of vehicle, including commercial vehicles (e.g., busses, tractor-trailer vehicles), on-road vehicles, and off-road vehicles (e.g., tractors, crop harvesting equipment). In the example of FIG. 1B, the vehicle 110 includes a forward-looking camera module 102 arranged to capture images of scenes in front of the vehicle 110. Such forward-looking camera module 102 can be used for any suitable purpose, such as lane-keeping assist, collision warning systems, distance-pacing cruise-control systems, autonomous driving systems, and proximity detection. The example vehicle 100 further comprises a backward-looking camera module 102 arranged to capture images of scenes behind the vehicle 110. Such backward-looking camera module 102 can be used for any suitable purpose, such as collision warning systems, reverse direction video, autonomous driving systems (e.g., monitoring position of overtaking vehicles, backing up), and proximity detection. The example vehicle 110 further comprises a side-looking camera module 102 arranged to capture images of scenes beside the vehicle 110. Such side-looking camera module can be used for any suitable purpose, such as blind-spot monitoring, collision warning systems, autonomous driving systems (e.g., monitoring position of overtaking vehicles, lane-change detection), and proximity detection. In situation in which the imaging system 100 is a vehicle, the imaging controller 108 may be controller of the vehicle 110. The discussion now turns in greater detail to the example image sensor 106 of the camera module 102.

Figure 2:
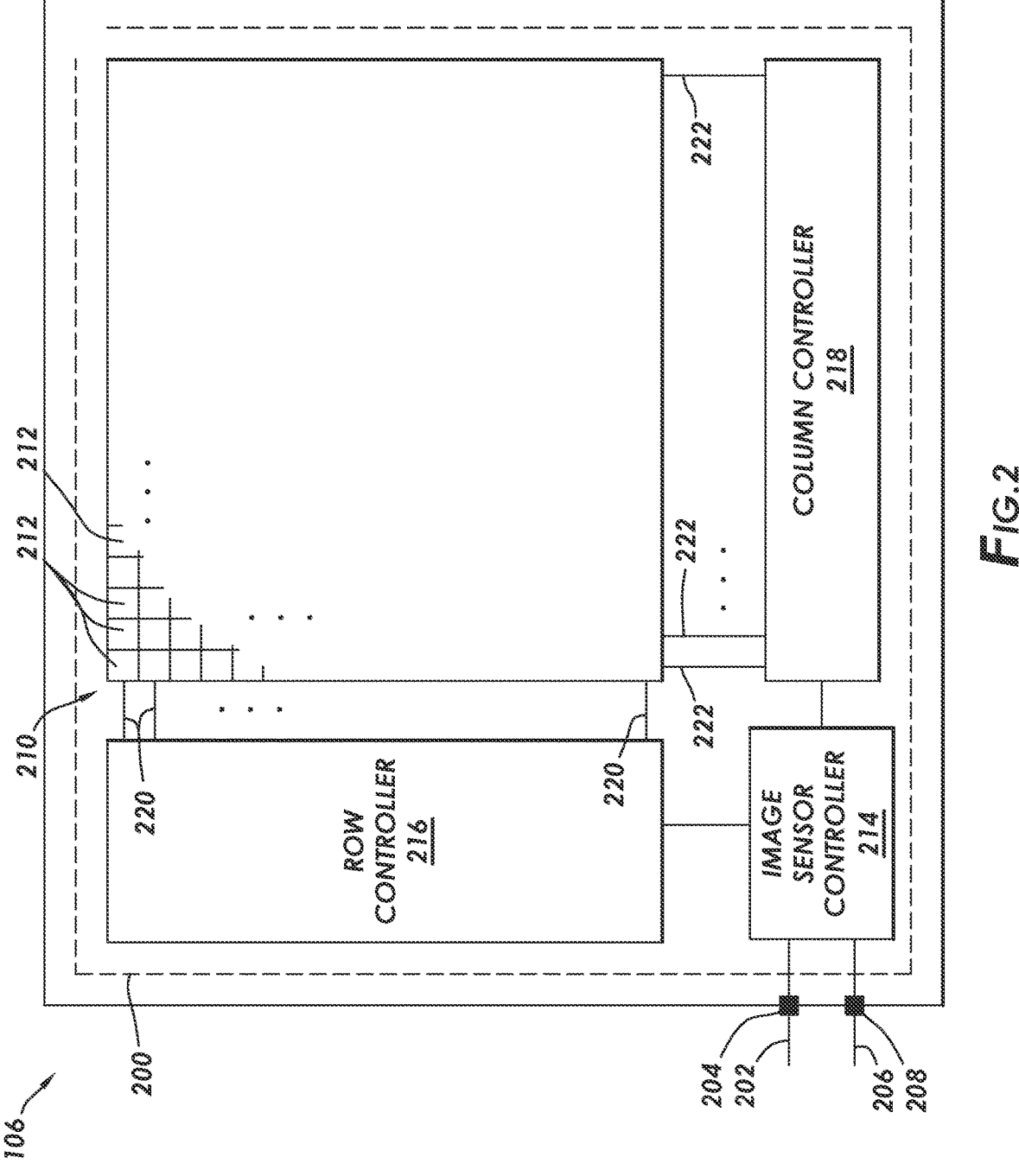
FIG. 2 shows an image sensor in accordance with at least some embodiments.

FIG. 2 shows an example image sensor 106. In particular, FIG. 2 shows that the image sensor 106 may comprise a substrate 200 of semiconductor material (e.g., silicon) encapsulated within packaging to create a packaged semiconductor device or packaged semiconductor product. Bond pads or other connection points of the substrate 200 couple to terminals of the image sensor 106 (e.g., serial communication channel 202 coupled to terminal(s) 204, and capture input 206 coupled to terminal 208). Additional terminals will be present (e.g., ground or common, power), but the additional terminals are omitted so as not to unduly complicate the figure. While a single substrate 200 is shown, in other cases multiple substrates may be combined to form the image sensor 106 (e.g., a multi-chip module).

The image sensor 106 comprises a pixel array 210 containing a plurality of image pixels 212 arranged in rows and columns. Pixel array 210 may comprise, for example, hundreds or thousands of rows and columns of image pixels 212. Control and readout of the pixel array 210 may be implemented by an image sensor controller 214 coupled to a row controller 216 and a column controller 218. The example row controller 216 may receive row addresses from image sensor controller 214 and supply corresponding row control signals to image pixels 212 (e.g., reset, row-select, charge transfer, dual conversion gain, and readout control signals). The row control signals may be communicated over one or more conductors, such as row control paths 220.

Column controller 218 (sometimes referred to as a column control circuit, readout circuit, or column decoder) may be coupled to the pixel array 210 by way of one or more conductors, such as column lines 222. Column lines 222 may be used for reading out image signals from image pixels 212 and for supplying bias signals (e.g., bias currents or bias voltages) to image pixels 212. If desired, during pixel readout operations, a pixel row in the pixel array 210 may be selected using row controller 216 and image signals generated by image pixels 212 in that pixel row can be read out along column lines 222. The example column controller 218 may include sample-and-hold circuitry for sampling and temporarily storing image signals read out from pixel array 210, amplifier circuitry, analog-to-digital conversion (ADC) circuitry, bias circuitry, column memory, latch circuitry for selectively enabling or disabling the column circuitry, or other circuitry that is coupled to one or more columns of pixels in the pixel array 210 for operating the image pixels 212 and for reading out image signals from the image pixels 212. ADC circuitry in the column controller 218 may convert analog pixel values received from the pixel array 210 into corresponding digital image data. Column controller 218 may supply digital image data to the image sensor controller 214 and/or the imaging controller 108 (FIG. 1) over, for example, the serial communication channel 202.

Figure 3:
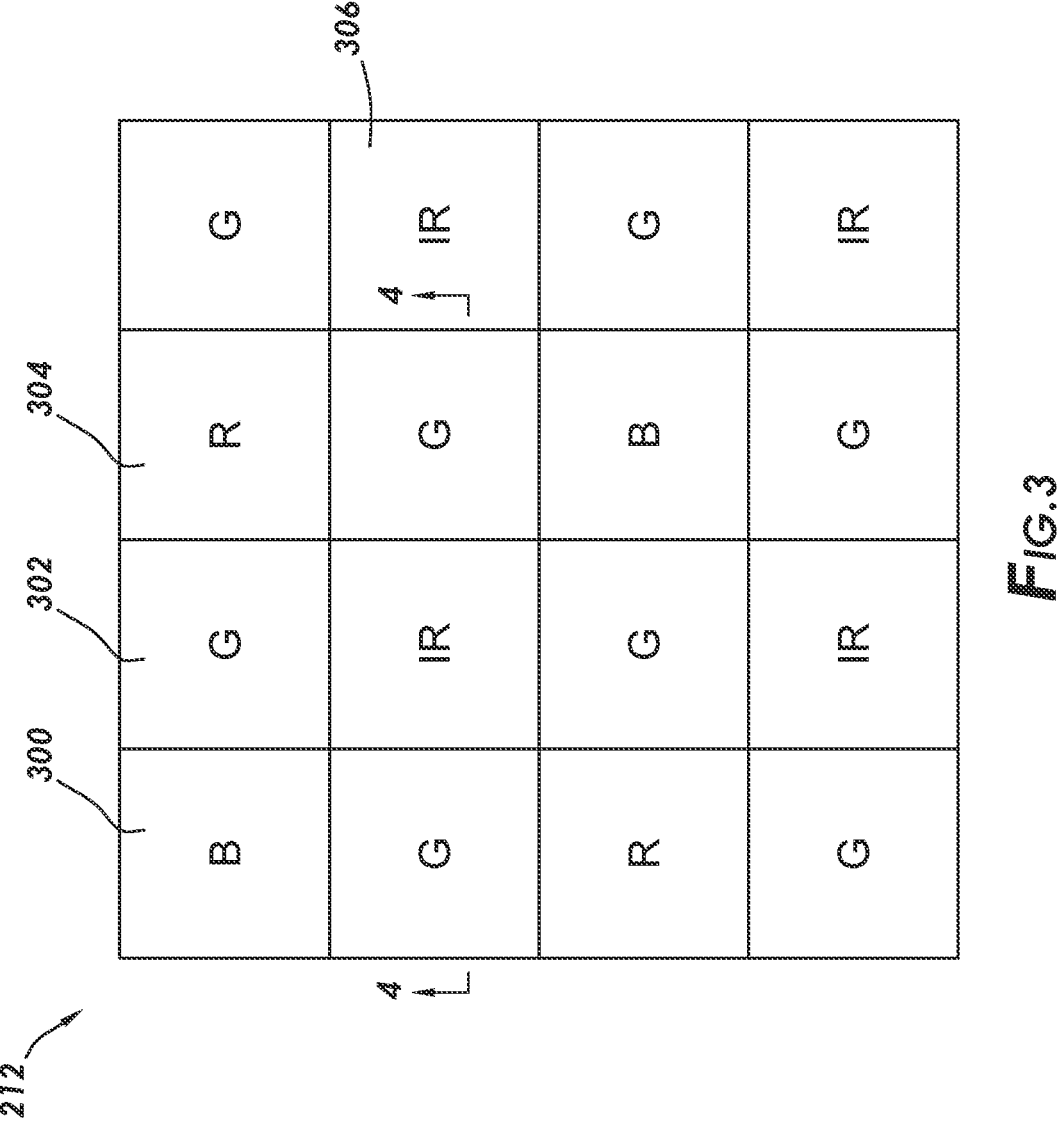
FIG. 3 shows an overhead view of an image pixel in accordance with at least some embodiments.

FIG. 3 shows an overhead view of an example image pixel 212. In particular, in example cases each image pixel 212 comprises a plurality of sensors designed and constructed to be sensitive to light having a particular wavelength. The example image pixel 212 comprises a four-by-four array of sensors designed for sensing red, green, blue, and IR. More particularly, the example image pixel 212 comprises sixteen sensors arranged as a color-filter array (CFA) or color-filter mosaic (CFM) that includes multiple blue sensors 300 sensitive to blue light, multiple green sensors 302 sensitive to green light, multiple red sensors 304 sensitive to red light, and multiple IR sensors 306 sensitive to infrared light. The example image pixel 212 may thus be referred to as an RGB-IR pixel. The number of sensors, and the color sensitivity, of image pixel 212 is merely an example. The relative number of each color sensitivity may be different. The colors to which image pixel 212 is sensitive may be different. For example, the image pixel 212 may be sensitive to: red, yellow, yellow, blue (RYYB-IR); cyan, yellow, yellow, magenta (CYYM-IR); cyan, yellow, green, magenta (CYGM-IR); red, green, blue, white (RGBW-IR). Thus, the color proportions, and the arrangement, of the example image pixel 212 shall not be deemed a limitation.

Figure 4:
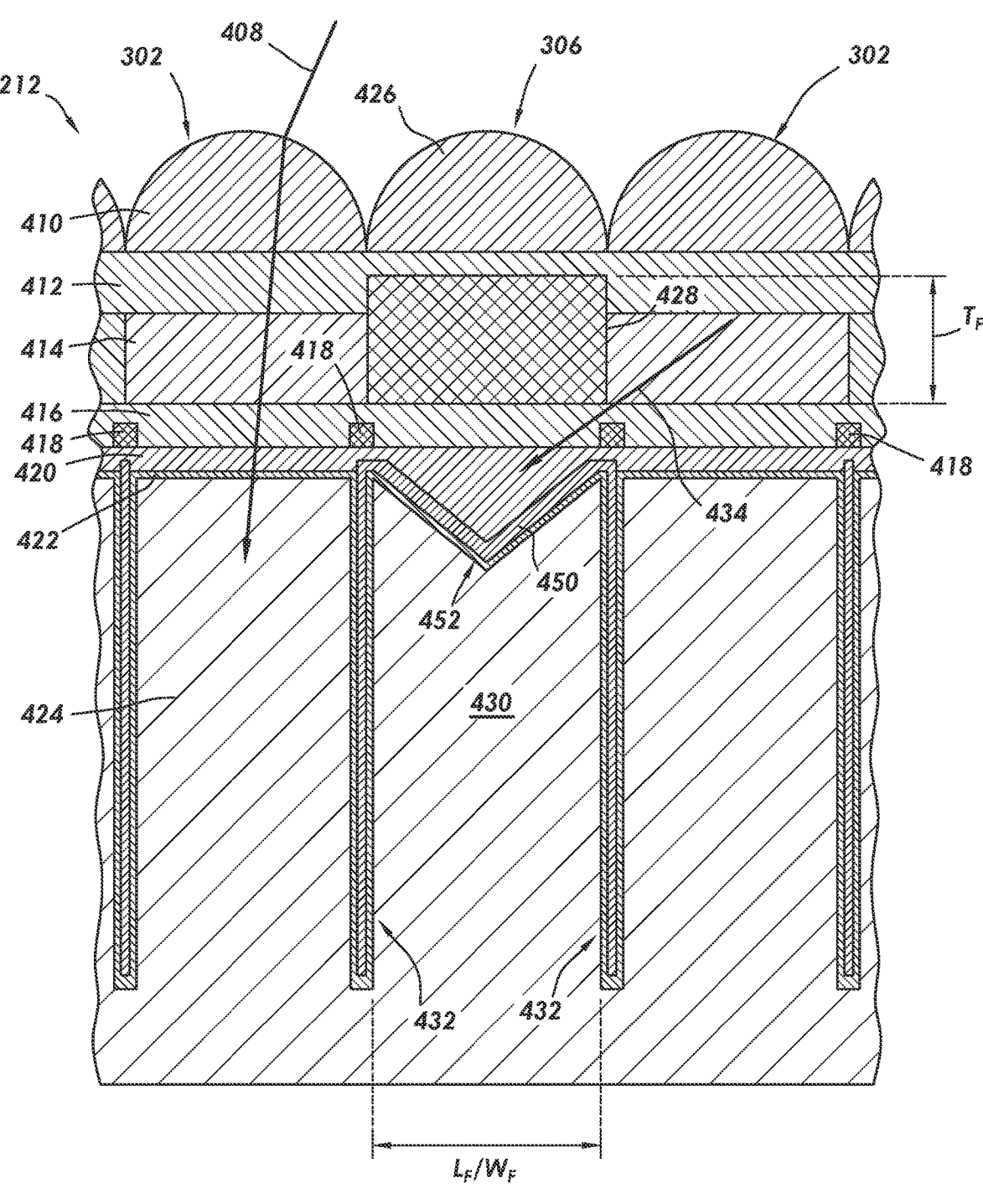
FIG. 4 shows a partial cross-sectional view of an image pixel taken line 4-4 of FIG. 3, and in accordance with at least some embodiments.

FIG. 4 shows a partial cross-sectional view of the example image pixel 212 taken line 4-4 of FIG. 3. In particular, FIG. 4 shows a portion of a green sensor 302 on each side of an IR sensor 306. Referring initially to the green sensor 302 on the left, consider light 408 (illustrated by the arrow) entering the green sensor 302. The light 408 initially encounters a microlens 410. The example microlens 410 may be a spherical lens designed and constructed to direct the incoming light 408 into the lower regions of the sensor. For the example green sensor 302, the light 408 then encounters an optical filter being green filter 414. The material comprising green filter 414 is designed and constructed to pass light having wavelengths corresponding to the green color (e.g., about 550 nm), and to filter other visible colors. The light 408 then passes through an example oxide layer 416 having embedded therein a grid of metallic material 418 (e.g., grid of titanium nitride/tungsten bilayer). In the cross-sectional view of FIG. 4, the grid of metallic material 418 is visible only as the cross-sections of conductors that make up the grid, but in practice the conductors form a grid pattern overlaying the perimeter of each photosensitive region (e.g., grid of squares). The light 408 then passes through an example silicon dioxide layer ($SiO_2$ layer 420), then through another example oxide layer 422 (e.g., comprising: aluminum oxide and tantalum oxide; hafnium oxide and tantalum oxide; aluminum-hafnium-oxide and tantalum oxide; or aluminum oxide and hafnium oxide). The oxide layer 422 may be used to reduce "dark current" (e.g., current caused by thermal generation of electrons). The example light 408 then passes into the photosensitive region 424 where the light is absorbed. The absorption of the light produces a corresponding electrical signal in which a parameter of the electrical signal (e.g., amplitude of the current, amplitude of the voltage) is indicative of the intensity of the light 408 received (e.g., the number of photons received during the detection period).

For the imaging pixel 212, and with respect to the direction of travel of the light 408, the microlens 410 resides above the green filter 414. The green filter 414 resides above oxide layer 416 with the embedded grid of metallic material 418. The oxide layer 416 resides above the SiO$_2$ layer 420. The SiO$_2$ layer 420 resides above the oxide layer 422. And at least a portion of the oxide layer 422 resides above the photosensitive region 424. Working the opposite direction, the photosensitive region 424 resides below at least a portion of the oxide layer 422. The oxide layer 422 resides below the SiO$_2$ layer 420. The SiO$_2$ layer 420 resides below the oxide layer 416 with its embedded grid of metallic material 418. The oxide layer 416 resides below the color filter, in the example case of the green sensor 302 the color filter being the green filter 414. And the color filter resides below the microlens 410.

FIG. 4, by virtue of the cut to produce the cross-sectional view, shows two green sensors 302. However, blue sensors 300 (FIG. 3) and red sensors 304 (FIG. 3) have a similar structure, differing only in the nature of the optical filter between the respective microlens and the oxide layer 416. For example, a blue sensors 300 will each include an optical filter being a blue filter designed and constructed to pass light having wavelengths corresponding to the color blue (e.g., about 450 nm), and to filter other visible colors. Similarly, a red sensors 304 will each include an optical filter being a red filter designed and constructed to pass light having wavelengths corresponding to the color red (e.g., about 600 nm), and to filter other visible colors.

Turning now to the example IR sensor 306. The example IR sensor 306 has a microlens 426, which may be constructed contemporaneously with other microlenses of the image pixel 212. Beneath the microlens 426 resides an optical filter being an IR filter 428. The example IR filter 428 is designed and constructed to pass infrared energy (e.g., wavelengths of about 800 to 1000 nm) and to filter the color wavelengths (e.g., 750 nm and below, and in some cases 850 nm and below). Stated otherwise, the IR filter 428 is designed and constructed to reduce visible light and to pass infrared light. The example IR filter 428 may be an organic polymer and/or a thin-film dielectric material. As shown in the proportions of FIG. 4 (not necessarily to scale), the IR filter 428 may have a thickness T$_F$ measured perpendicular the horizontal plane of the image pixel 212 that is thicker than the thicknesses (correspondingly measured) of the surrounding color filters. In some cases, the thickness T$_F$ of the IR filter 428 may be between and including 750 nm and 950 nm. In cases where the thickness T$_F$ of IR filter 428 is greater than the thickness of one or more of the surrounding color filters, the example image pixel 212 may include a planarization layer 412 such that the microlenses are created and placed at the same elevation with respect to the photosensitive layers.

The example IR sensor 306 further comprises, beneath the IR filter 428, the oxide layer 416 including the embedded grid of metallic material 418. In some cases, the oxide layer

416 and embedded grid of metallic material 418 are a continuous structure simultaneously created across the image pixel 212, and in some cases across the entire pixel array 210 (FIG. 2). Beneath the oxide layer 416 and embedded grid of metallic material 418 resides the SiO$_2$ layer 420. In some cases, the SiO$_2$ layer 420 is a continuous structure simultaneously created across the image pixel 212, and in some case across the entire pixel array 210. Beneath the SiO$_2$ layer 420 resides the photosensitive region 430 for the IR sensor 306.

In various examples, each photosensitive region is physically delineated by a trench that surrounds the photosensitive region and thus defines perimeter of the photosensitive region. For example, the photosensitive region 430 of the example IR sensor 306 defines trench 432 that surrounds the photosensitive region 430. The trench may be referred to as a backside deep trench isolation (BDTI) structure, but again in practice the trench surrounds each photosensitive region. The trench may go all the way down and completely surround the photosensitive region 430—full depth trench isolation. As shown, the trench provides partial depth trench isolation. The trench may be created from the front side or backside. As shown, the trench is created from the backside or the BSI (Back Side Illuminated) side. In the cross-sectional view of FIG. 4, the trench 432 is likewise shown in cross-section and thus only two sides of the trench 432 are visible. In some example cases, the photosensitive regions define squares when viewed in horizontal cross-sections (e.g., the overhead view of FIG. 3). Thus, the example trench 432 defines a square when viewed from above. The example trench 432 defines a closed bottom and "open" top. As discussed in greater detail below, the trench 432 is filled with various materials, and thus the "open" top describes the trench prior to deposition of the further materials. If different horizontal shapes for the photosensitive regions are used, so too would change the shape of the trench 432.

Still referring to FIG. 4, in example case the IR filter 428 has a length L$_F$ and a width W$_F$, and thus a perimeter, that is at least coextensive with perimeter of the photosensitive region 430. Given the example horizontal cross-sectional shape of the photosensitive region is square, FIG. 4 can be considered to show either the length L$_F$ or the width W$_F$ of the IR filter 428. Stated differently, the example photosensitive region 430 has a length and a width measured between inside surfaces of the trench with the measurement in a horizontal plane parallel to any planarized feature (e.g., top of the SiO2 layer 420). The example IR filter 428 has the length L$_F$ or the width W$_F$ that is at least the same as the length and the width of the photosensitive region 430. In some cases, the length L$_F$ and/or the width W$_F$ of the IR filter 428 may be greater than the length and the width of the photosensitive region 430.

The IR sensor 306 is predominantly sensitive to infrared because of the presence of optical filters, such as IR filter 428. That is, the optical filters reduce visible light entering the photosensitive region 430. The photosensitive region 430 itself, however, does not discriminate regarding absorption, and in fact has a greater quantum efficiency percentage in the absorption of visible light than infrared light. The following equation provides a quantitative measure of efficiency of reducing visible light entry into a photosensitive region in comparison to infrared:

$$\frac{VIS}{NIR}\% = \frac{\int_{400}^{700} QE\ \%_{IR} d\lambda}{\int_{800}^{1000} QE\ \%_{IR} d\lambda} \times 100 \qquad (1)$$

where VIS/NIR % is the visible light to infrared light absorption percentage, $d\lambda$ is wavelength in nanometers, and QE $\%_{IR}$ is quantum efficiency of absorption. The example IR filter 428, disposed between the microlens 426 and the upper surface of the photosensitive region 430, standing alone may create a VIS/NIR % of about 30%. It follows, however, that even with a well-designed IR filter 428, a certain amount of visible light may still find its way into the photosensitive region 430 of the IR sensor 306. For example, light arriving with a high angle of incidence, such as light 434 (shown as an arrow), may pass through a thin corner of the IR filter 428 or pass under the IR filter 428. Moreover, light within adjacent photosensitive regions may tunnel or otherwise propagate into the photosensitive region 430 of the example IR sensor 306. Visible light that finds its way into the photosensitive region 430 of the IR sensor 306 will be incorrectly counted as infrared.

In order to further reduce the amount of visible light from reaching the photosensitive region 430 of the IR sensor 306, example embodiments implement a second optical filter between the IR filter 428 and the upper surface of the photosensitive region 430. In particular, in various embodiments a lower IR filter 450 is disposed between the upper IR filter 428 and the photosensitive region 430 of each IR sensor 306.

The example photosensitive region 430 of FIG. 4 includes a diffuser 452 in the form of an inverted pyramid structure. Other diffusers are possible, such as trench structures, cylinders, and nano-materials. Regardless of the precise nature of the diffuser 452, the diffuser 452 scatters the infrared light entering the photosensitive region 430 to increase the path length of light within the photosensitive region 430 to increase the probability of absorption. In the example of FIG. 4, the lower IR filter 450 directly abuts the oxide layer 422 and in a conformal arrangement with diffuser 452. Stated another way, the lower IR filter 450 follows the contours of the diffuser 452. Other examples without a diffuser are shown and discussed below.

The example lower IR filter 450 may be an inorganic material. In one example, the lower IR filter 450 may be a dielectric. In another example, the lower IR filter 450 may be aluminum nitride (AlN), aluminum antimonide (AlSb), or combinations of aluminum nitride and aluminum antimonide. In the example case of aluminum nitride, aluminum antimonide, and combinations, the lower IR filter 450 may have a film thickness of about 120 nm.

Still referring to FIG. 4, in example cases the lower IR filter 450 defines a perimeter that is at least coextensive with perimeter of the photosensitive region 430 (e.g. when viewed from above the image pixel 212). Given the example horizontal cross-sectional shape of the photosensitive region 430 being square, FIG. 4 can be considered to show either a length $L_F$ or a width $W_F$ of the portion of the lower IR filter 450 at the upper end of the photosensitive region 430. Stated differently, the example photosensitive region 430 has a length and a width measured between inside surfaces of the trench and measured in a horizontal plane parallel to any planarized feature. Thus, the example lower IR filter 450 has the length $L_F$ and the width $W_F$ that is at least coextensive with the length and the width of the photosensitive region 430. In some cases, the length $L_F$ and/or the width $W_F$ of the IR filter 428 may be greater than the length and the width of the photosensitive region 430, such as when the lower IR filter 450 extends into the trench 432 surrounding the photosensitive region 430.

In order to reduce the visible light from within adjacent photosensitive regions tunneling or otherwise propagating into the photosensitive region 430, in some cases the lower IR filter 450 may extend into the trench 432 surrounding and defining the photosensitive region 430. In particular, during manufacture of the image pixel 212, the lower IR filter 450 material may be grown or deposited over the image pixel 212, including filling the trench 432. So as not to adversely affect operation of the color sensors, the image pixel 212 may be patterned (e.g., with a photoresist) and then the material of the lower IR filter 450 over the color sensors may be etched away.

The IR sensor 306 is predominantly sensitive to infrared because of the presence of the upper IR filter 428 and the lower IR filter 450. The IR filters 428 and 450 reduce visible light from reaching the photosensitive region 430. In example cases of IR sensor 306 having the upper IR filter 428 and the lower IR filter 450, the IR sensor 306 may have a VIS/NIR % of between and including 30% and 1%, in some cases between and including 15% and 3%, and in a particular case less than 5%.

Still referring to FIG. 4, in the example IR sensor 306 the upper IR filter 428 is disposed above oxide layer 416 (with its embedded grid of metallic material 418), and the upper IR filter 428 is below the microlens 426. In the example of FIG. 4, the lower IR filter 450 is in a conformal arrangement over the diffuser 452 of the photosensitive region 430. However, other arrangements are possible.

Figure 5:
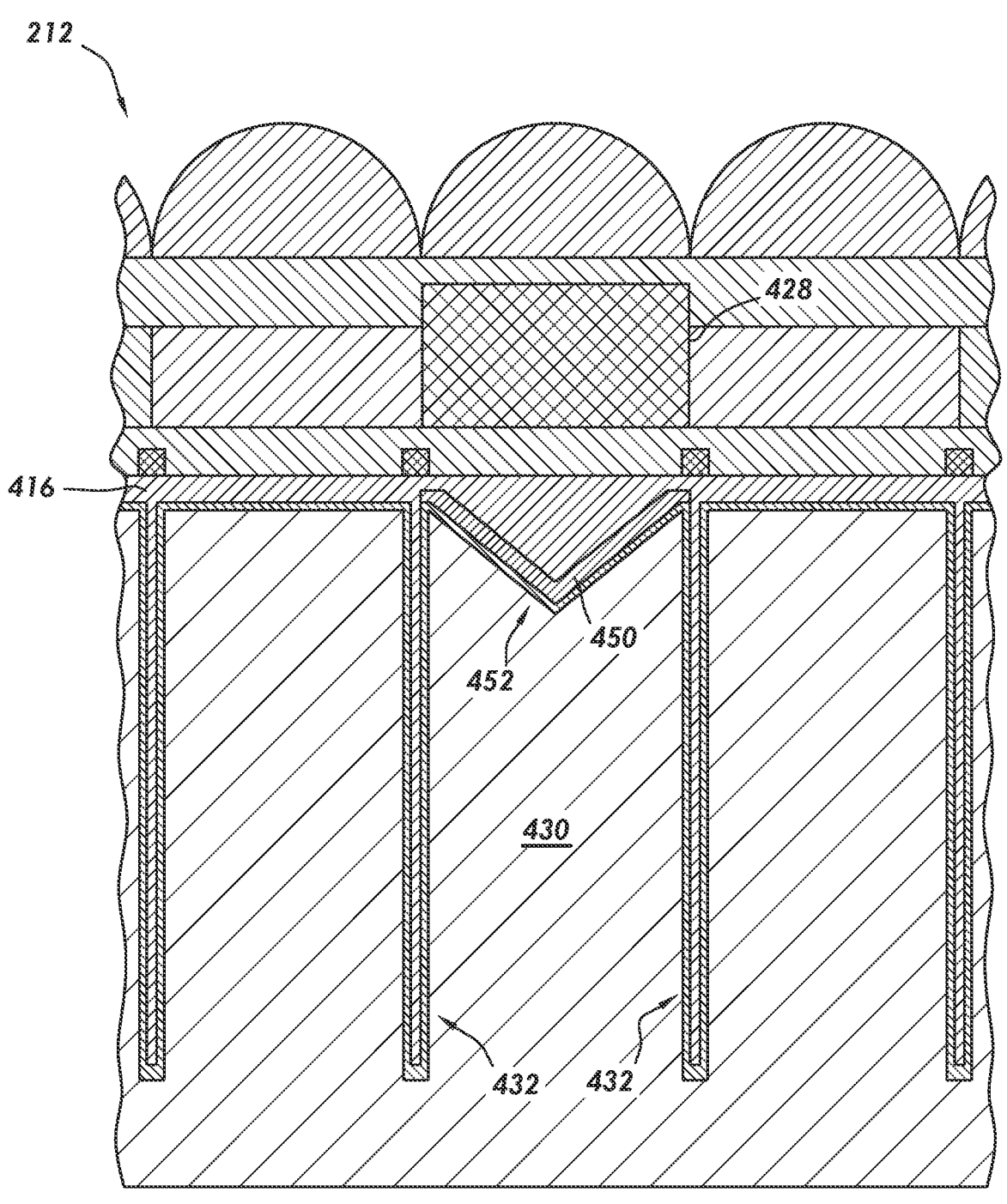
FIG. 5 shows a partial cross-sectional view of an image pixel taken line 4-4 of FIG. 3, and in accordance with at least some embodiments.

FIG. 5 shows a partial cross-sectional view of the example image pixel 212 also taken line 4-4 of FIG. 3. Many of the structures of the image pixel 212 of FIG. 5 are the same as discussed with respect to FIG. 4, and the duplicative structures will not be presented again here so as not to unduly lengthen the discussion. In the example of FIG. 5, again the lower IR filter 450 is disposed between the upper IR filter 428 and the photosensitive region 430 of each IR sensor 306. As before, the photosensitive region 430 includes the diffuser 452 in the example form of the inverted pyramid structure, and the lower IR filter 450 directly abuts the oxide layer 422 in a conformal arrangement with diffuser 452.

The example lower IR filter 450 defines a perimeter that is coextensive with perimeter of the photosensitive region 430. Stated differently, the example photosensitive region 430 has a length and a width measured between inside surfaces of the trench and the measurement in a horizontal plane parallel to any planarized feature. The example lower IR filter 450 has the length and/or width that is at least coextensive with the length and the width of the photosensitive region 430. However, in FIG. 5 the material of the lower IR filter 450 does not extend into the trench 432. Such a lower IR filter 450 still acts to remove or reduce visible light entering from above the photosensitive region 430. If desired, other structures may be placed in the trench 432 to block light entry at any desired wavelength, or block all light.

Figure 6:
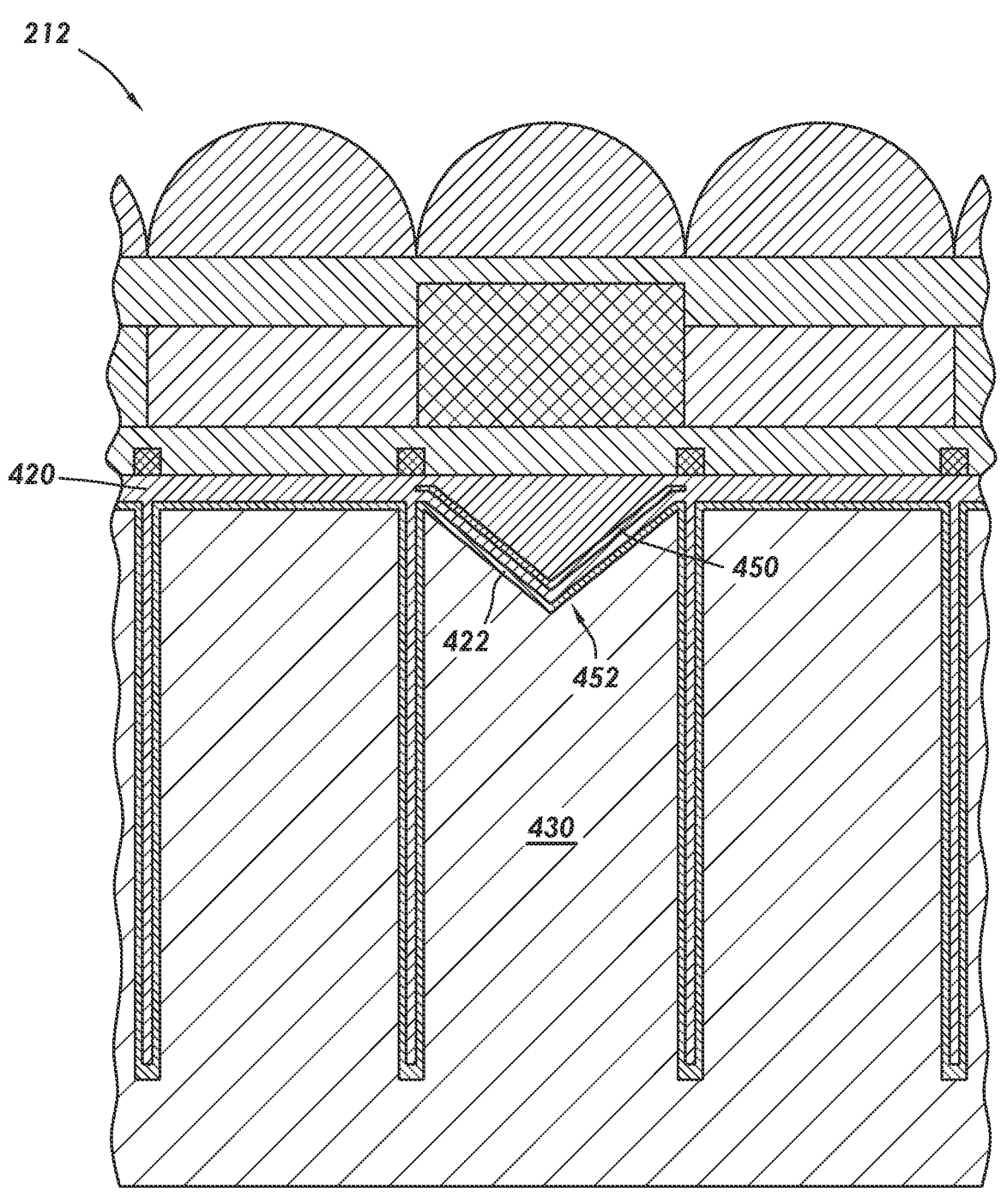
FIG. 6 shows a partial cross-sectional view of an image pixel taken line 4-4 of FIG. 3, and in accordance with at least some embodiments.

FIG. 6 shows a partial cross-sectional view of the example image pixel 212 also taken line 4-4 of FIG. 3. Many of the structures of the image pixel 212 of FIG. 6 are the same as discussed with respect to FIG. 4, and the duplicative structures will not be presented again here so as not to unduly lengthen the discussion. In the example of FIG. 6, again the lower IR filter 450 is disposed between the upper IR filter 428 and the photosensitive region 430 of each IR sensor 306. As before, the photosensitive region 430 includes the diffuser 452 in the example form of the inverted pyramid structure. In the example of FIG. 6, however, a portion of the SiO2 layer 420 resides between the lower IR filter 450 and the oxide layer 422. Still though in the embodiments of FIG. 6, the lower IR filter 450 is in a conformal arrangement with diffuser 452.

The arrangement of FIG. 6 may be used depending upon the nature of the oxide layer 422 and the nature of the material that implements the lower IR filter 450. For example, if the selected material for one or both of the oxide layer 422 and/or the lower IR filter 450 do not adhere well to the each other, the SiO2 layer 420 may be interposed to address such processing issues. In other cases, the selected material for one or both of the oxide layer 422 and/or the lower IR filter 450 may not be a factor, and instead the SiO2 layer 420 may be interposed for the purpose of disposing the lower IR filter 450 further above the photosensitive region 430.

In the various embodiments discussed to this point, each IR sensor 306 includes a diffuser 452 in the example form of an inverted pyramid structure, and the remaining color sensors lack such a diffuser. However, in yet still further cases all the color sensors and the IR sensor may include a diffuser similar in form to diffuser 452. In such cases, it may be possible to compensate the digital image data of each image pixel 212 for the presence of infrared in the scene captured. That is, the response of the IR sensors may be combined in some form (e.g., averaged) and then subtracted in whole or in part from the response of each color sensor to reduce or remove infrared response that passes the color filters of each color sensor.

Figure 7:
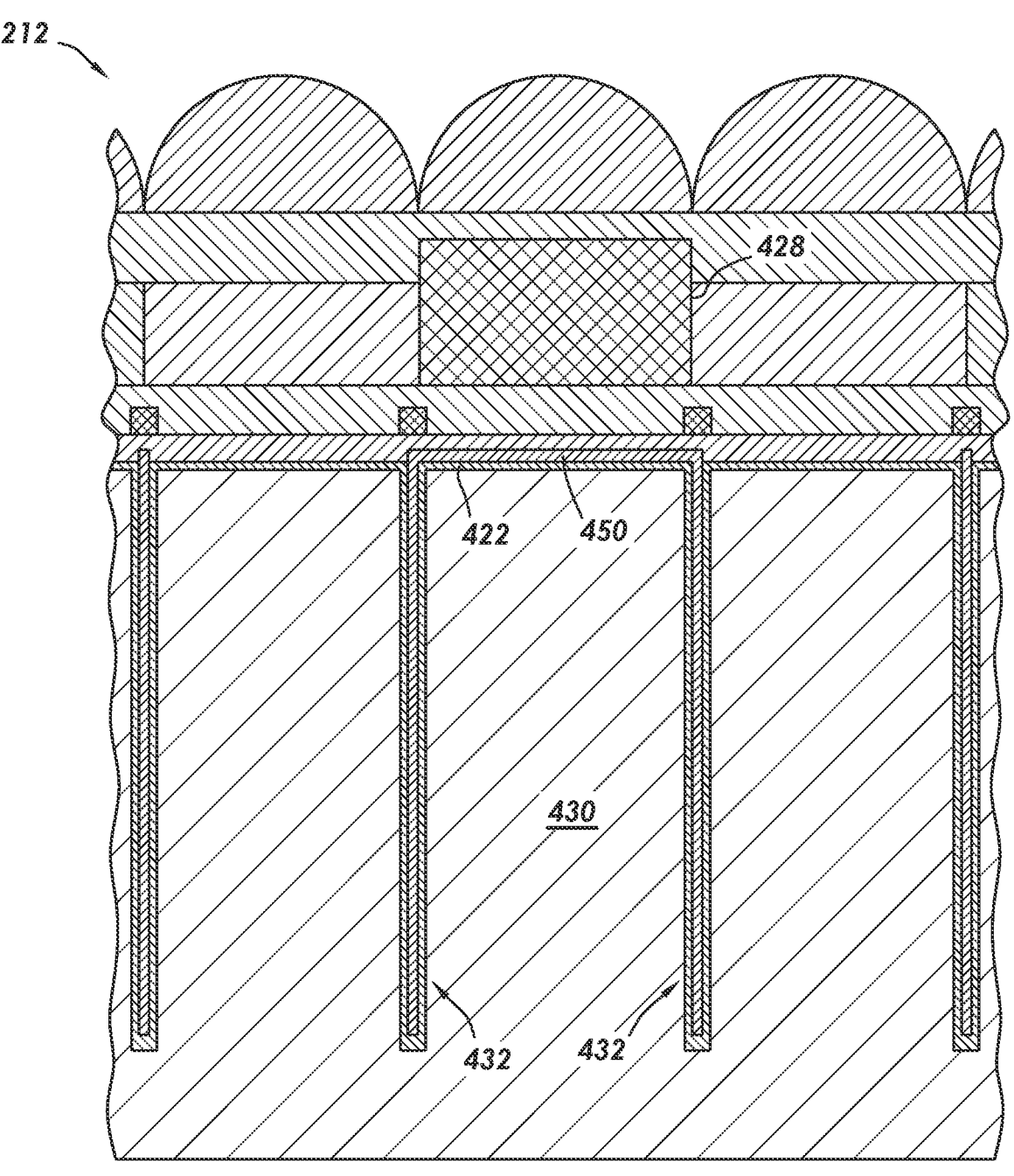
FIG. 7 shows a partial cross-sectional view of an image pixel taken line 4-4 of FIG. 3, and in accordance with at least some embodiments.

FIG. 7 shows a partial cross-sectional view of the example image pixel 212 also taken line 4-4 of FIG. 3. Many of the structures of the image pixel 212 of FIG. 7 are the same as discussed with respect to FIG. 4, and the duplicative structures will not be presented again here so as not to unduly lengthen the discussion. In the example of FIG. 7, again the lower IR filter 450 is disposed between the upper IR filter 428 and the photosensitive region 430 of each IR sensor 306. In the case of FIG. 7, however, there is no diffuser associated with the photosensitive region 430. Thus, the lower IR filter 450 directly abuts the oxide layer 422 at the upper end of the photosensitive region 430.

The example lower IR filter 450 defines a perimeter that is coextensive with perimeter of the photosensitive region 430. Stated differently, the example photosensitive region 430 has a length and a width measured between inside surfaces of the trench, the measurement in a horizontal plane parallel to any planarized feature. The example lower IR filter 450 has a length and/or a width that is at least coextensive with the length and the width of the photosensitive region 430. Moreover, in FIG. 7 the lower IR filter 450 extend into the trench 432.

In the example of FIG. 7, none of the sensors include a diffuser. Again, in such cases, it may be possible to compensate the digital image data of each image pixel 212 for the presence of infrared in the scene captured. That is, the response of the IR sensors may be combined in some form (e.g., averaged) and then subtracted in whole or in part from the response of each color sensor to remove the infrared response that passes the color filters of each color sensor.

Figure 8:
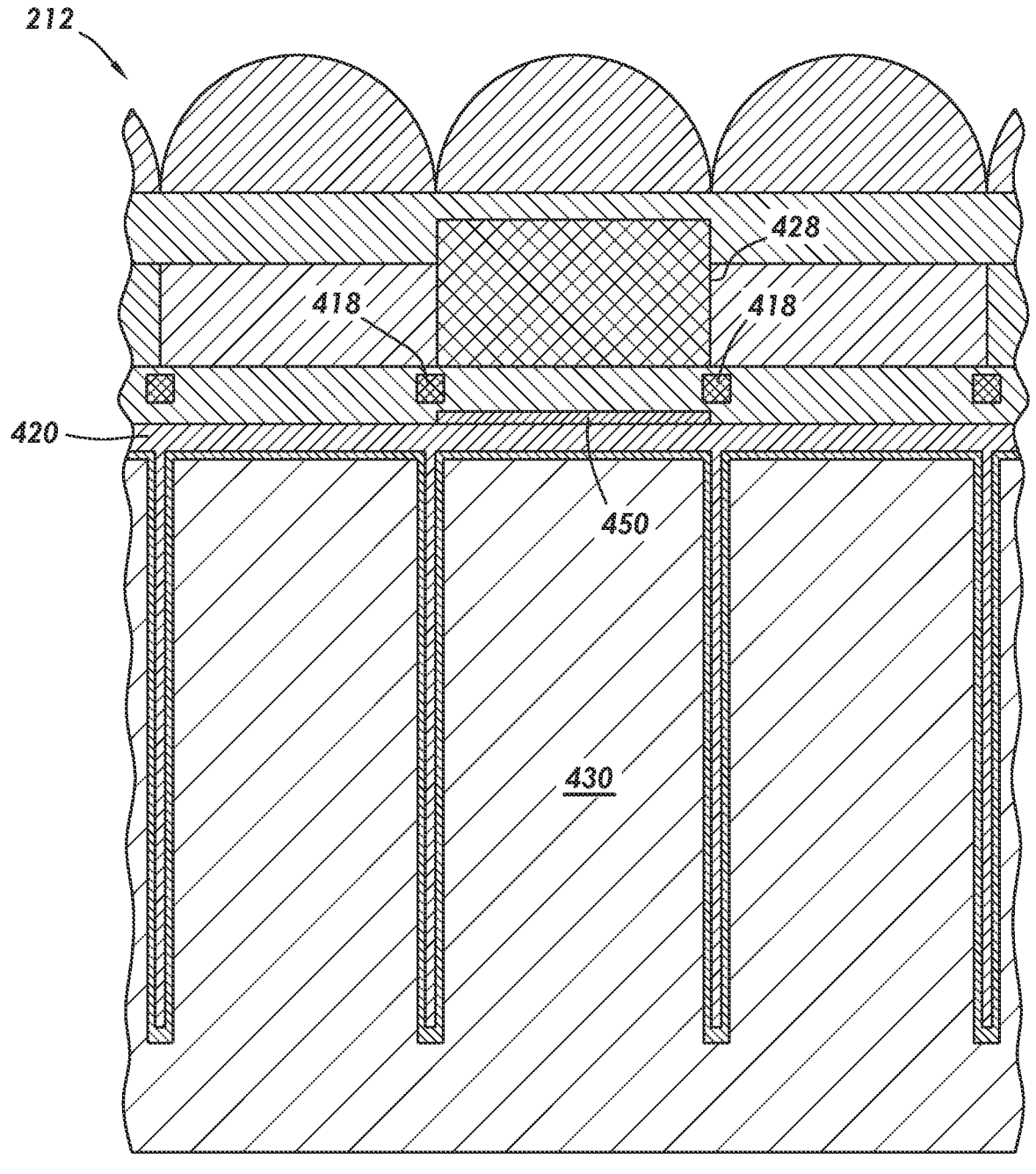
FIG. 8 shows a partial cross-sectional view of an image pixel taken line 4-4 of FIG. 3, and in accordance with at least some embodiments.

FIG. 8 shows a partial cross-sectional view of the example image pixel 212 also taken line 4-4 of FIG. 3. Many of the structures of the image pixel 212 of FIG. 8 are the same as discussed with respect to FIG. 4, and the duplicative structures will not be presented again here so as not to unduly lengthen the discussion. In the example of FIG. 8, again the lower IR filter 450 is disposed between the upper IR filter 428 and the photosensitive region 430 of each IR sensor 306. In the case of FIG. 8, however, the lower IR filter 450 is disposed between the SiO2 layer 420 and the grid of metallic material 418. More particularly still, in the example of FIG. 8 the lower IR filter 450 is disposed on the planarized upper surface of the SiO2 layer 420 and within oxide layer 416.

The example lower IR filter 450 of FIG. 8 defines a perimeter that is at least coextensive with perimeter of the photosensitive region 430. Stated differently, the example photosensitive region 430 has a length and a width measured between inside surfaces of the trench, the measurement in a horizontal plane parallel to any planarized feature. The example lower IR filter 450 has a length and width that is at least coextensive with the length and the width of the photosensitive region 430.

Figure 9:
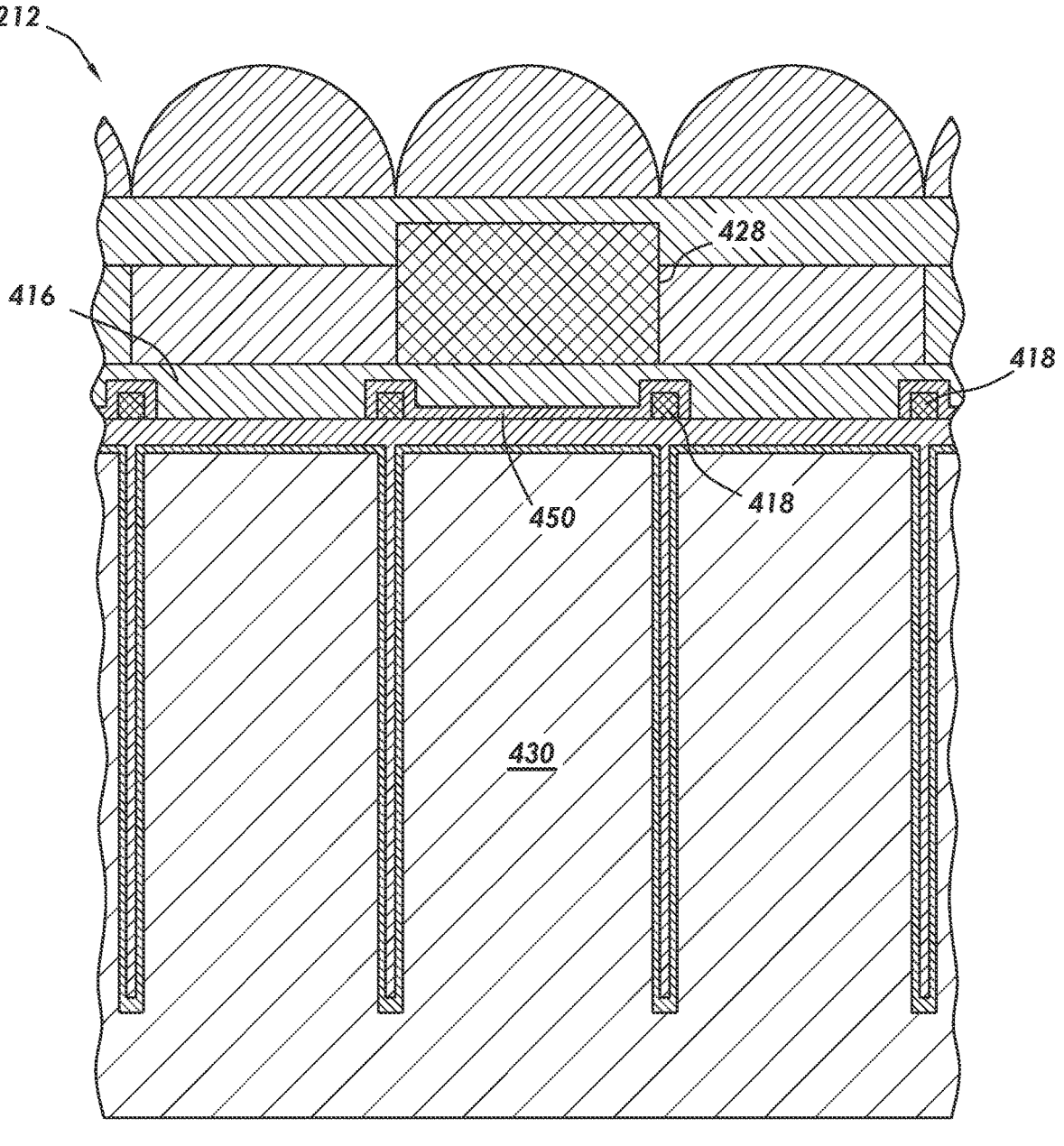
FIG. 9 shows a partial cross-sectional view of an image pixel taken line 4-4 of FIG. 3, and in accordance with at least some embodiments.

FIG. 9 shows a partial cross-sectional view of the example image pixel 212 also taken line 4-4 of FIG. 3. Many of the structures of the image pixel 212 of FIG. 9 are the same as discussed with respect to FIG. 4, and the duplicative structures will not be presented again here so as not to unduly lengthen the discussion. In the example of FIG. 9, again the lower IR filter 450 is disposed between the upper IR filter 428 and the photosensitive region 430 of each IR sensor 306. In the case of FIG. 9, however, the lower IR filter 450 is disposed between the upper IR filter 428 and the grid of metallic material 418. More particularly still, in the example of FIG. 9 the lower IR filter 450 is disposed in a conformal arrangement on the grid of metallic material 418. The oxide layer 416 is disposed over the lower IR filter 450, and the planarized upper surface of the oxide layer 416 is the surface upon which the microlenses are constructed.

The example lower IR filter 450 defines a perimeter that is at least coextensive with perimeter of the photosensitive region 430. Stated differently, the example photosensitive region 430 has a length and a width measured between inside surfaces of the trench, the measurement in a horizontal plane parallel to any planarized feature. In some cases, and as shown, the length and/or the width of the lower IR filter 450 may be greater than the length and the width of the photosensitive region 430. The greater length and width of the example lower IR filter 450 of FIG. 9 may be better for blocking light having large angles of incidence.

Figure 10:
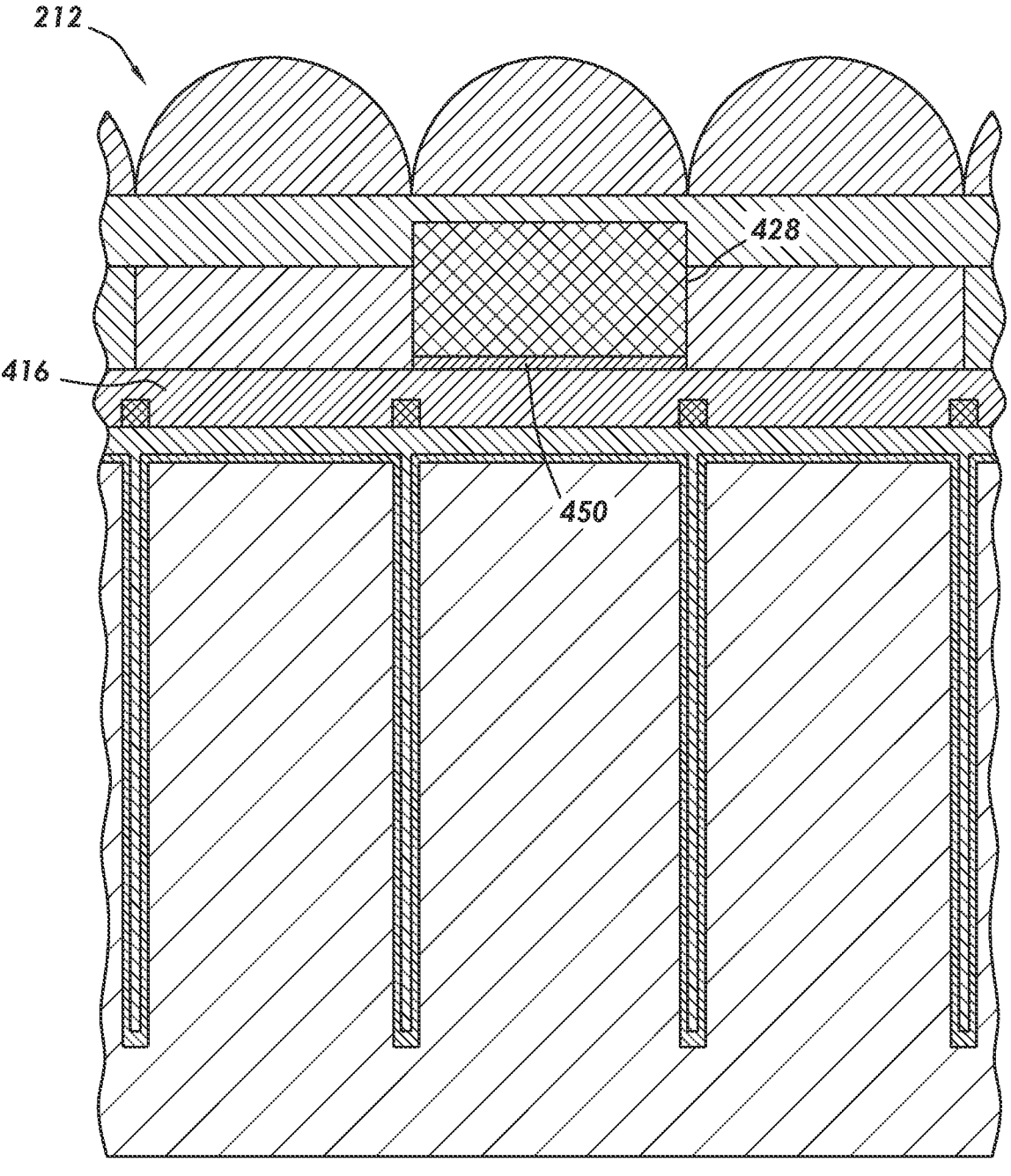
FIG. 10 shows a partial cross-sectional view of an image pixel taken line 4-4 of FIG. 3, and in accordance with at least some embodiments.

FIG. 10 shows a partial cross-sectional view of the example image pixel 212 also taken line 4-4 of FIG. 3. Many of the structures of the image pixel 212 of FIG. 10 are the same as discussed with respect to FIG. 4, and the duplicative structures will not be presented again here so as not to unduly lengthen the discussion. In the example of FIG. 10 again the lower IR filter 450 is disposed between the upper IR filter 428 and the photosensitive region 430 of each IR sensor 306. In the case of FIG. 10, however, the lower IR filter 450 is disposed between the upper IR filter 428 and the grid of metallic material 418. More particularly still, in the example of FIG. 9 the lower IR filter 450 is disposed on the oxide layer 416.

The example lower IR filter 450 defines a perimeter that is at least coextensive with perimeter of the photosensitive region 430. Stated differently, the example photosensitive region 430 has a length and a width measured between inside surfaces of the trench, the measurement in a horizontal plane parallel to any planarized feature.

FIGS. 4-10 shows various example placements of the lower IR filter 450 in relation to the upper IR filter 428. However, in yet still further examples three or more optical filters may be present, comprising combination of FIG. 4-10. For example, a lower IR filter may be in a conformal arrangement with the photosensitive region (e.g., FIG. 4), a middle IR filter may be disposed between the upper IR filter and the lower IR filter (e.g., any of the optical filters of FIGS.

8-10). Thus, having two optical filters associated with the IR sensor shall not necessarily be read as limitation. However, in other cases each IR sensor may have only two optical filters.

Figure 11:
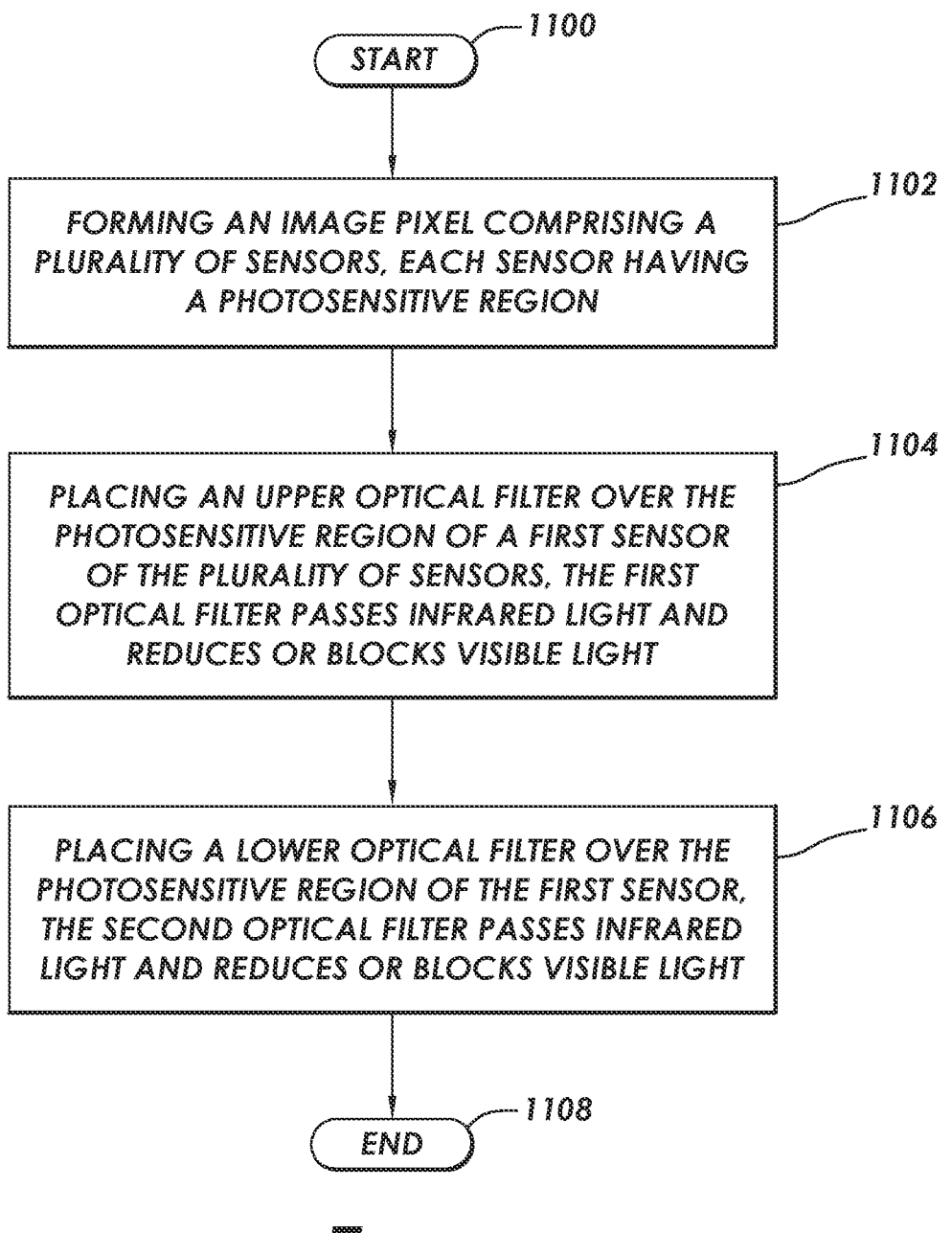
FIG. 11 shows a method in accordance with at least some embodiments.

FIG. 11 shows a method of constructing an image sensor in accordance with at least some embodiments. In particular, the method starts (block 1100) and comprises: forming an image pixel comprising a plurality of sensors, each sensor having a photosensitive region (block 1102); placing an upper optical filter over the photosensitive region of a first sensor of the plurality of sensor, the first optical filter passes infrared light and reduces or blocks visible light (block 1104); and placing a lower optical filter over the photosensitive region of the first sensor, the second optical filter passes infrared light and reduces or blocks visible light (block 1106). Thereafter the method ends (block 1108).

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An image sensor comprising:
a photosensitive region;
a lower optical filter above the photosensitive region, and the lower optical filter configured to block visible light and to pass infrared light;
an upper optical filter above the lower optical filter, and the upper optical filter configured to block visible light and to pass infrared light;
an oxide layer between the upper optical filter and the lower optical filter;
a silicon dioxide layer between the photosensitive region and the oxide layer; and
a grid of metallic material embedded in the oxide layer and abutting the silicon dioxide layer,
wherein the lower optical filter abuts the silicon dioxide layer and the grid of metallic material.

2. The image sensor of claim 1 further comprising
the lower optical filter disposed between the upper optical filter and the grid of metallic material.

3. The image sensor of claim 2 further comprising the lower optical filter disposed in a conformal arrangement on the grid of metallic material.

4. The image sensor of claim 1 further comprising the lower optical filter abutting the oxide layer, the oxide layer further disposed between the upper optical filter and the photosensitive region, the oxide layer comprising at least one selected from a group consisting of: aluminum oxide and tantalum oxide; hafnium oxide and tantalum oxide; aluminum-hafnium-oxide and tantalum oxide; and aluminum oxide and hafnium oxide.

5. The image sensor of claim 1 wherein the lower optical filter is at least one selected from a group consisting of: aluminum nitride (AlN); and aluminum antimonide (AlSb).

6. An imaging system comprising:
a lens system;

an image sensor in operational relationship to the lens system;
an imaging system controller electrically coupled to the image sensor;
the image sensor comprising an array of image pixels, at least one image pixel of the array of image pixels having an IR sensor, and the IR sensor comprising:
a photosensitive region defining a perimeter;
a lower optical filter above the photosensitive region, the lower optical filter defines a perimeter coextensive with the perimeter of the photosensitive region, and the lower optical filter configured to block visible light and to pass infrared light;
an upper optical filter above the lower optical filter, the upper optical filter defines a perimeter coextensive with the perimeter of the photosensitive region, and the upper optical filter configured to block visible light and to pass infrared light;
an oxide layer between the upper optical filter and the lower optical filter;
a silicon dioxide layer between the photosensitive region and the oxide layer; and
a grid of metallic material embedded in the oxide layer and abutting the silicon dioxide layer,
wherein the lower optical filter abuts the silicon dioxide layer and the grid of metallic material.

7. The imaging system of claim 6 wherein the image sensor further comprises:
the lower optical filter disposed between the upper optical filter and the grid of metallic material.

8. The imaging system of claim 7 wherein the image sensor further comprises the lower optical filter disposed in a conformal arrangement on the grid of metallic material.

9. The imaging system of claim 6 wherein the lower optical filter is at least one selected from a group consisting of: aluminum nitride (AlN); and aluminum antimonide (AlSb).

10. The imaging system of claim 6 wherein the imaging system is at least one selected from a group consisting of: an automobile; a vehicle; a camera; a cellular telephone; a tablet computer; a webcam; a video camera; a video surveillance system; and a video gaming system.

11. A method of constructing an image sensor, the method comprising:
forming an image pixel comprising a plurality of sensors, each sensor having a photosensitive region;
placing an upper optical filter over the photosensitive region of a first sensor of the plurality of sensors, the upper optical filter passes infrared light and blocks visible light;
placing a lower optical filter over the photosensitive region of the first sensor, the lower optical filter passes infrared light and blocks visible light;
placing an oxide layer between the upper optical filter and the lower optical filter;
placing a silicon dioxide layer between the photosensitive region and the oxide layer; and
placing a grid of metallic material embedded in the oxide layer and abutting the silicon dioxide layer,
wherein the lower optical filter abuts the silicon dioxide layer and the grid of metallic material.

12. The method of claim 11 wherein placing the upper optical filter further comprises placing the upper optical filter between a microlens for the first sensor and the grid of metallic material.

13. The method of claim 12 wherein placing the lower optical filter further comprises placing the lower optical filter in a conformal arrangement on the grid of metallic material and in a layer between the upper optical filter and the grid of metallic material.

14. The method of claim 11 wherein the lower optical filter is at least one selected from a group consisting of: aluminum nitride (AlN); and aluminum antimonide (AlSb).

* * * * *